United States Patent
Park et al.

(10) Patent No.: US 7,672,166 B2
(45) Date of Patent: Mar. 2, 2010

(54) METHOD OF PROGRAMMING IN A NON-VOLATILE MEMORY DEVICE AND NON-VOLATILE MEMORY DEVICE FOR PERFORMING THE SAME

(75) Inventors: Ki-Tae Park, Seongnam-si (KR); Yeong-Taek Lee, Seoul (KR); Ki-Nam Kim, Seoul (KR); Doo-Gon Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 229 days.

(21) Appl. No.: 11/955,891

(22) Filed: Dec. 13, 2007

(65) Prior Publication Data
US 2008/0151633 A1 Jun. 26, 2008

(30) Foreign Application Priority Data
Dec. 22, 2006 (KR) ...................... 10-2006-0132813

(51) Int. Cl.
*G11C 16/06* (2006.01)
(52) U.S. Cl. ............. 365/185.19; 365/203; 365/185.25; 365/185.01
(58) Field of Classification Search ............ 365/185.19, 365/293, 185.25, 185.01
See application file for complete search history.

(56) References Cited

U.S. PATENT DOCUMENTS

| 6,011,287 A | 1/2000 | Itoh et al. |
| 7,170,788 B1 * | 1/2007 | Wan et al. ............... 365/185.18 |
| 2008/0117684 A1 * | 5/2008 | Hemink .................. 365/185.19 |

FOREIGN PATENT DOCUMENTS

| JP | 11-120779 A | 4/1999 |
| KR | 1020050108136 A | 11/2005 |
| KR | 2006-0067970 A | 6/2006 |

* cited by examiner

*Primary Examiner*—Thong Q Le
(74) *Attorney, Agent, or Firm*—Myers Bigel Sibley & Sajovec

(57) ABSTRACT

Provided are methods for programming in a non-volatile memory device, using incremental step pulses as a program voltage that is applied to a selected wordline. Methods may include applying a precharge voltage to an even bitline and an odd bitline such that the even bitline and the odd bitline are alternately charged with the precharge voltage and a boosted voltage that is higher than the precharge voltage. Methods may further include applying a bitline voltage corresponding to program data to a selected bitline of the even bitline and the odd bitline.

23 Claims, 13 Drawing Sheets

US 7,672,166 B2

METHOD OF PROGRAMMING IN A NON-VOLATILE MEMORY DEVICE AND NON-VOLATILE MEMORY DEVICE FOR PERFORMING THE SAME

CROSS-REFERENCE TO RELATED APPLICATIONS

This application claims priority under 35 USC §119 to Korean Patent Application No. 2006-132813, filed on Dec. 22, 2006 in the Korean Intellectual Property Office (KIPO), the disclosure of which is incorporated herein in its entirety by reference.

BACKGROUND

The present invention relates to semiconductor devices, and more particularly to methods of programming memory devices and memory devices.

Semiconductor memory devices may be typically classified into non-volatile memory devices that maintain stored data even though power is off and volatile memory devices that lose stored data when power is off. The non-volatile memory devices may include electrically erasable programmable read-only memory (EEPROM) in which stored data can be electrically erased and then new data can be reprogrammed.

Operations of an EEPROM may include a program mode for writing data into a memory cell, a read mode for reading the data stored in the memory cell, and an erase mode for initializing a memory cell by deleting the stored data. In an incremental step pulse programming (ISPP) method, verification and reprogramming may be repealed by using incremental step pulses until desired data is stored.

In flash memory devices pertaining to EEPROM, an erasing operation may be performed per memory block or sector, and a programming operation may be performed per page that includes a plurality of memory cells commonly coupled to a word line. The flash memory devices may be classified, according to a configuration of a memory cell array, into NAND flash memory devices in which cell transistors may be coupled in parallel between a bitline and a ground electrode, and NOR flash memory devices in which cell transistors may be coupled serially between a bitline and a ground electrode. A NAND flash memory device may have higher programming and erasing speeds than a NOR flash memory device, but may not provide access per byte in reading and programming operations.

FIG. 1 is a timing diagram illustrating a conventional method of programming in a non-volatile memory device. Referring to FIG. 1, a power supply voltage Vcc is applied to an even bitline BLe and an odd bitline BLo at time t1. A voltage Vcc+Vth corresponding to a sum of the power supply voltage Vcc and a threshold voltage Vth of a string selection transistor is applied to a string selection line SSL at time t2. Thus, the string selection transistor is turned on and a channel of a memory cell is precharged at the power supply voltage Vcc.

When a program voltage Vpgm is applied to a selected wordline and a pass voltage Vpass is applied to unselected wordlines at time t3, the channel of the program-inhibited cell may be boosted to a voltage V1 higher than the power supply voltage Vcc due to capacitive coupling between the memory cells. When the program voltage Vpgm is deactivated at time t5, a cycle of a programming operation is finished.

FIG. 1 illustrates an example where the power supply voltage Vcc as a program-inhibiting voltage is applied to the program-inhibited bitline and the channel of the memory cell coupled to the program-inhibited bitline is boosted to the voltage V1 higher than the power supply voltage Vcc. On the contrary, a program-enabling voltage as a program-enabling voltage (for example, a ground voltage of 0 V) may be applied to a program-enabled bitline. The memory cell coupled to the program-enabled bitline can be programmed through Fowler-Nordheim (F-N) tunneling since a voltage difference between a floating gate and a channel may be relatively high in the memory cell coupled to the program-enabled bitline.

FIG. 2 is a diagram illustrating voltage variations of bitlines and channels in the programming method of FIG. 1. The voltage variations according to ISPP, in which voltage levels of pulses are sequentially increased by a step $\Delta ISPP$, are illustrated in FIG. 2 with respect to a program-inhibited even bitline BLe, a channel of a memory cell coupled to the program-inhibited even bitline BLe, a program-inhibited odd bitline BLo, and a channel of a memory cell coupled to the program-inhibited odd bitline BLe.

A precharge voltage (for example, a power supply voltage Vcc) may be simultaneously applied to the bitlines BLe and BLo before (N−2)th through (N+2)th pulses are sequentially applied to a selected wordline. Thus, program-inhibited even and odd bitlines BLe and BLo may be maintained at the power supply voltage Vcc and the channels of the memory cells coupled thereto may be boosted to a voltage V1 higher than the power supply voltage Vcc when the pulse is applied to the selected wordline.

For example, the even bitlines BLe can be selected so that the memory cells coupled to the even bitlines are programmed according to loaded program data. In this case, the voltages of the even bitlines BLe may become either the power supply voltage Vcc (i.e., the program-inhibiting voltage) or the ground voltage of 0 V (i.e., the program-enabling voltage) according to each bit of the loaded program data. For convenience of description. the voltage of the program-enabled even bitlines is omitted in FIG. 2. The unselected odd bitlines BLo maintain the program-inhibiting voltage, that is, the power supply voltages Vcc regardless of the bit values of the program data, which are loaded, for example, in page buffers.

As the integration degree of a memory device is increased and the size of memory cells therein is decreased, a capacitance between a channel and a floating gale may be increased and a leakage current from the channel to a substrate body may be increased. The increased capacitance and the leakage current cause program disturbance since the boosted voltage V1 of the channel is decreased. The program disturbance represents undesired programming such that the memory cells coupled to the program-inhibited bitlines are programmed because the voltage difference between the channel and the floating gate is great enough to induce the F-N tunneling due to an insufficient boosting effect.

In a non-volatile memory device using a relatively low power supply-voltage as a precharge voltage, the program disturbance may become more serious. The higher power supply may be required to reduce the program disturbance. A method of increasing a boosting efficiency is disclosed in Japanese Patent Laid-Open Publication No. 1999-120779, capable of obtaining a higher channel voltage by increasing a boosting efficiency with the same level of a power supply voltage.

FIG. 3 is a circuit diagram illustrating a conventional non-volatile memory device. Referring to FIG. 3, the non-volatile memory device includes a memory cell array 10 consisting of memory cells 11 coupled to even bitlines BLe and memory cells 12 coupled to odd bitlines BLo. A pair of even and odd bitlines is commonly coupled to each page buffer 20 through bitline selection transistors T11 and T12.

The switching operation of the bitline selection transistors T11 and T12 is controlled by selection signals SS1 and SS2. The bitlines BLe and BLo are coupled to transistors T21 and T22 for applying precharge voltages VA1 and VA2 (for example, a power supply voltage Vcc), respectively, and the transistors T21 and T22 are controlled by precharge signals PRA1 and PRA2.

In the non-volatile memory device 50, the precharged bitlines BLe and BLo may be boosted by controlling activation timings of the precharge signals PRA1 and PRA2, and then the bitline selection transistors may be simultaneously turned on. Accordingly, the even and odd bitlines BLe and BLo commonly have a boosted voltage Vbst by charge sharing after the precharge operation is completed. The boosted voltage may be determined in Equation 1, as follows:

$$Vbst=(Vcc+\beta Vcc)/2=(1+\beta/2)Vcc \quad \text{Equation 1}$$

where a power supply voltage Vcc is used as a precharge voltage, and a bitline coupling coefficient $\beta$ is determined according to a configuration of the memory cell formed in the substrate.

FIG. 4 is a diagram illustrating voltage variations of bitlines and channels in the non-volatile memory device of FIG. 3. Since the bitline coupling coefficient $\beta$ is a positive value, the bitlines are boosted to a voltage $(1+\beta/2)Vcc$ that is greater than the precharge voltage Vcc and the channels of the memory cells coupled to the program-inhibited even and odd bitlines BLe and BLo are commonly boosted to a voltage V1a. The boosted channel voltage V1a of FIG. 4 is greater than the boosted channel voltage V1 of FIG. 2.

The non-volatile memory device 50 can increase a channel voltage by capacitive coupling between the adjacent bitlines. A time for turning on the transistors T11 and T12, however, may be required for the charge sharing between the adjacent even and odd bitlines BLe and BLo, and thus the programming time may be increased. If the incremental step pulses are used as the program voltage Vpgm, increased turning-on time of the transistors T11 and T12 may be required for each step pulse and the entire programming time may be further increased.

SUMMARY OF THE INVENTION

Some example embodiments of the present invention provide methods of programming in a non-volatile memory device, using incremental step pulses as a program voltage that is applied to a selected wordline. Some embodiments of such methods may include applying a precharge voltage to an even bitline and an odd bitline such that the even bitline and the odd bitline are alternately charged with the precharge voltage and a boosted voltage that is higher than the precharge voltage and applying a bitline voltage corresponding to program data to a selected bitline of the even bitline and the odd bitline.

In some embodiments, applying the precharge voltage includes applying the precharge voltage to the odd bitline after floating the even bitline that is precharged with the precharge voltage and applying the precharge voltage to the even bitline after floating the odd bitline that is precharged with the precharge voltage.

Some embodiments provide that applying the precharge voltage to the odd bitline after floating the even bitline and applying the precharge voltage to the even bitline after floating the odd bitline are alternately repeated until writing of the program data into a memory cell is completed. In some embodiments, applying the precharge voltage to the odd bitline after floating the even bitline includes applying the precharge voltage to the even bitline, floating the even bitline after a channel of a memory cell coupled to the even bitline is charged with the precharge voltage and applying the precharge voltage to the odd bitline to boost the floated even bitline to the boosted voltage.

In some embodiments, applying the precharge voltage to the even bitline after floating the odd bitline includes applying the precharge voltage to the odd bitline, floating the odd bitline after a channel of a memory cell coupled to the odd bitline is charged with the precharge voltage and applying the precharge voltage to the even bitline to boost the floated odd bitline to the boosted voltage.

In some embodiments, a channel of a memory cell coupled to the selected bitline having the precharge voltage is boosted to a first voltage and a channel of a memory cell coupled to the selected bitline having the boosted voltage is further boosted to a second voltage higher than the first voltage, when each of the incremental step pulses is applied to the selected wordline.

Some embodiments provide that applying the precharge voltage includes connecting a first transistor for supplying the precharge voltage to the even bitline, connecting a second transistor for supplying the precharge voltage to the odd bitline, and controlling switching timings of the first and second transistors such that the even bitline and the odd bitline are alternately charged with the precharge voltage and the boosted voltage.

In some embodiments, controlling the switching timings of the first and second transistors includes turning on the second transistor after turning off the first transistor and turning on the first transistor after turning off the second transistor. Some embodiments provide that turning on the second transistor after turning off the first transistor and turning on the first transistor after turning off the second transistor are alternately repeated until writing of the program data into a memory cell is completed.

In some embodiments, turning on the second transistor after turning off the first transistor includes turning on the first transistor to apply the precharge voltage to the even bitline, turning off the first transistor after a channel of a memory cell coupled to the even bitline is charged with the precharge voltage, and turning on the second transistor to apply the precharge voltage to the odd bitline. In some embodiments, turning on the first transistor after turning off the second transistor includes turning on the second transistor to apply the precharge voltage to the odd bitline, turning off the second transistor after a channel of a memory cell coupled to the odd bitline is charged with the precharge voltage, and turning on the first transistor to apply the precharge voltage to the even bitline.

In some embodiments, applying the precharge voltage includes applying the precharge voltage to the odd bitline after floating the even bitline that is precharged with the precharge voltage during a precharge operation corresponding to an Nth pulse of the incremental step pulses and applying the precharge voltage to the even bitline after floating the odd bitline that is precharged with the precharge voltage during a precharge operation corresponding to a (N+1)th pulse of the incremental step pulses.

In some embodiments, the precharge voltage includes an internal power supply voltage of the non-volatile memory device. In some embodiments, the non-volatile memory device includes a NAND-type flash memory device.

Some embodiments provide that applying the bitline voltage includes applying a program-enabling voltage lower than the precharge voltage to the selected bitline when a corresponding bit value of the program data is logic low and maintaining the precharge voltage or the boosted voltage charged at the selected bitline when the corresponding bit value of the program data is logic high.

Some embodiments of the present invention may include non-volatile memory devices. Some embodiments of such devices may include a memory cell array including memory cells coupled to multiple bitlines and multiple wordlines, a precharge circuit that is configured to alternately apply a precharge voltage to an even bitline and an odd bitline of the multiple bitlines. The precharge voltage may be configured to alternately charge the even bitline and the odd bitline with the precharge voltage and a boosted voltage that is higher than the precharge voltage. Some embodiments of devices may include a page buffer block that is configured to apply a bitline voltage that corresponds to program data to a selected bitline of the even bitline and the odd bitline and a row selection circuit that is configured to apply incremental step pulses to a selected wordline of the wordlines.

In some embodiments, the precharge circuit is configured to apply the precharge voltage to the odd bitline after floating the even bitline that is precharged with the precharge voltage during a precharge operation corresponding to an Nth pulse of the incremental step pulses and further configured to apply the precharge voltage to the even bitline after floating the odd bitline that is precharged with the precharge voltage during a precharge operation corresponding to a (N+1)th pulse of the incremental step pulses.

In some embodiments, the precharge circuit includes a first transistor that is configured to control an electrical connection between the even bitline and a precharge voltage supply line and a second transistor that is configured to control an electrical connection between the odd bitline and the precharge voltage supply line. In some embodiments, the second transistor is configured to turn on after the first transistor turns off during a precharge operation corresponding to an Nth pulse of the incremental step pulses and the first transistor is configured to turn on after the second transistor turns off during a precharge operation corresponding to a (N+1)th pulse of the incremental step pulses.

Devices according to some embodiments may include a precharge control circuit that is configured to generate a first precharge signal that is applied to a gate of the first transistor and a second precharge signal that is applied to a gate of the second transistor, wherein the second precharge signal is activated after the first precharge signal is deactivated during a precharge operation corresponding to an Nth pulse of the incremental step pulses and the first precharge signal is activated after the second precharge signal is deactivated during a precharge operation corresponding to a (N+1)th pulse of the incremental step pulses.

In some embodiments, the boosted voltage is induced by capacitive coupling between adjacent ones of the even bitlines and the odd bitlines.

In some embodiments, a channel of the memory cell coupled to the bitline having the precharge voltage is boosted to a first voltage and a channel of the memory cell coupled to the bitline having the boosted voltage is further boosted to a second voltage that is higher than the first voltage, when each of the incremental step pulses is applied to the selected wordline.

In some embodiments, the precharge voltage includes an internal power supply voltage of the non-volatile memory device. In some embodiments, the non-volatile memory device includes a NAND-type flash memory device.

In some embodiments, the page buffer block is configured to apply a program-enabling voltage that is lower than the precharge voltage to the selected bitline when a corresponding bit value of the program data is logic low and wherein the page buffer block is further configured to maintain the precharge voltage or the boosted voltage that is charged in the selected bitline when the corresponding bit value of the program data is logic high.

DETAILED DESCRIPTION

Figure 1:
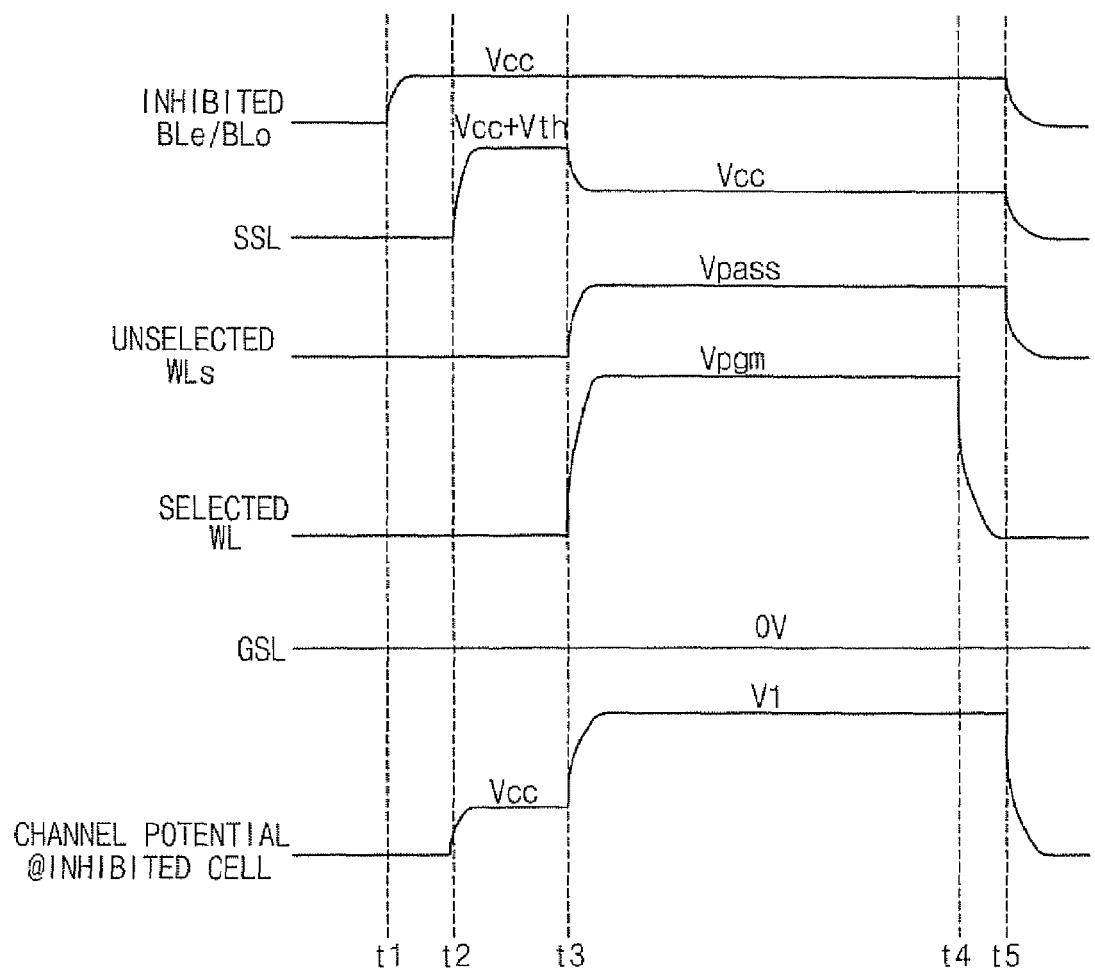
FIG. 1 is a timing diagram illustrating a conventional method of programming in a non-volatile memory device.
Figure 2:
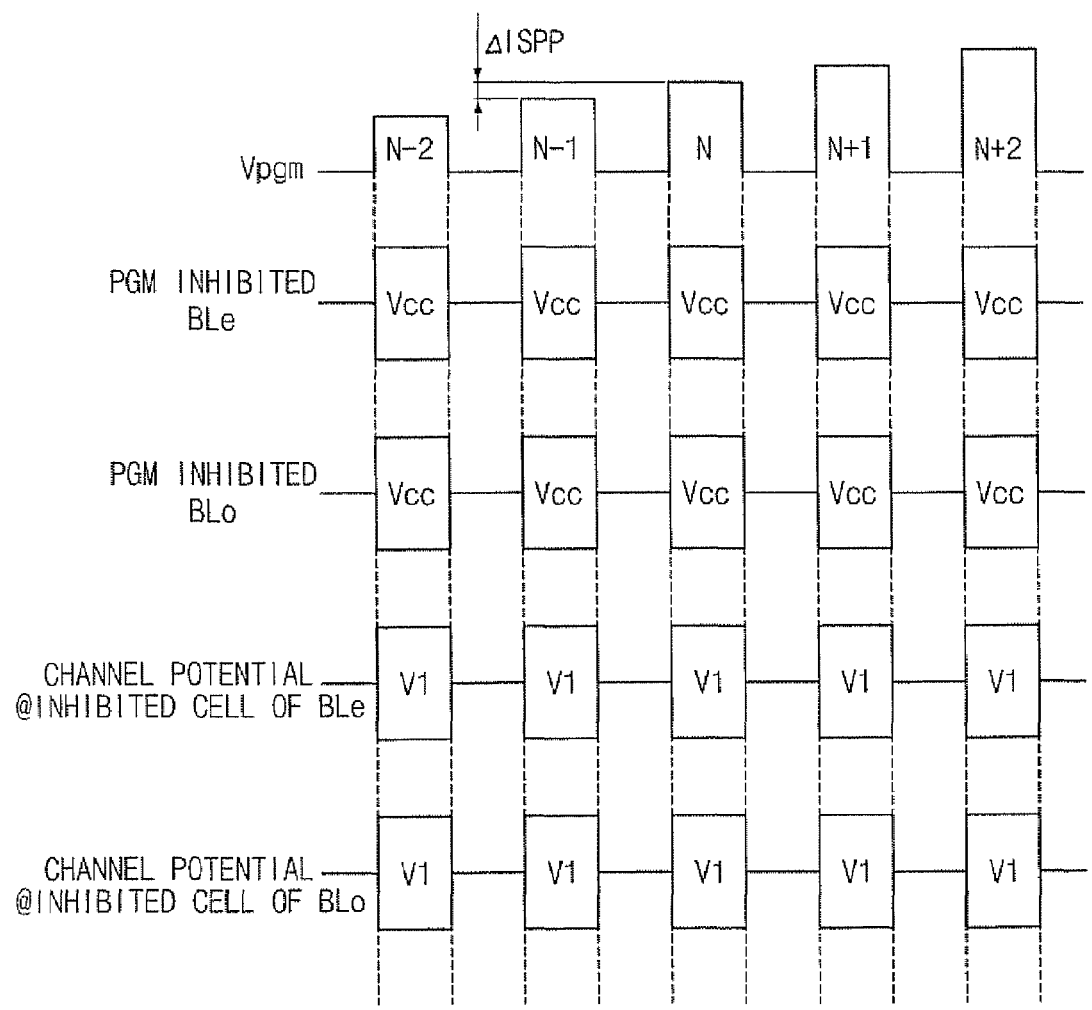
FIG. 2 is a diagram illustrating voltage variations of bitlines and channels in the programming method of FIG. 1.
Figure 3:
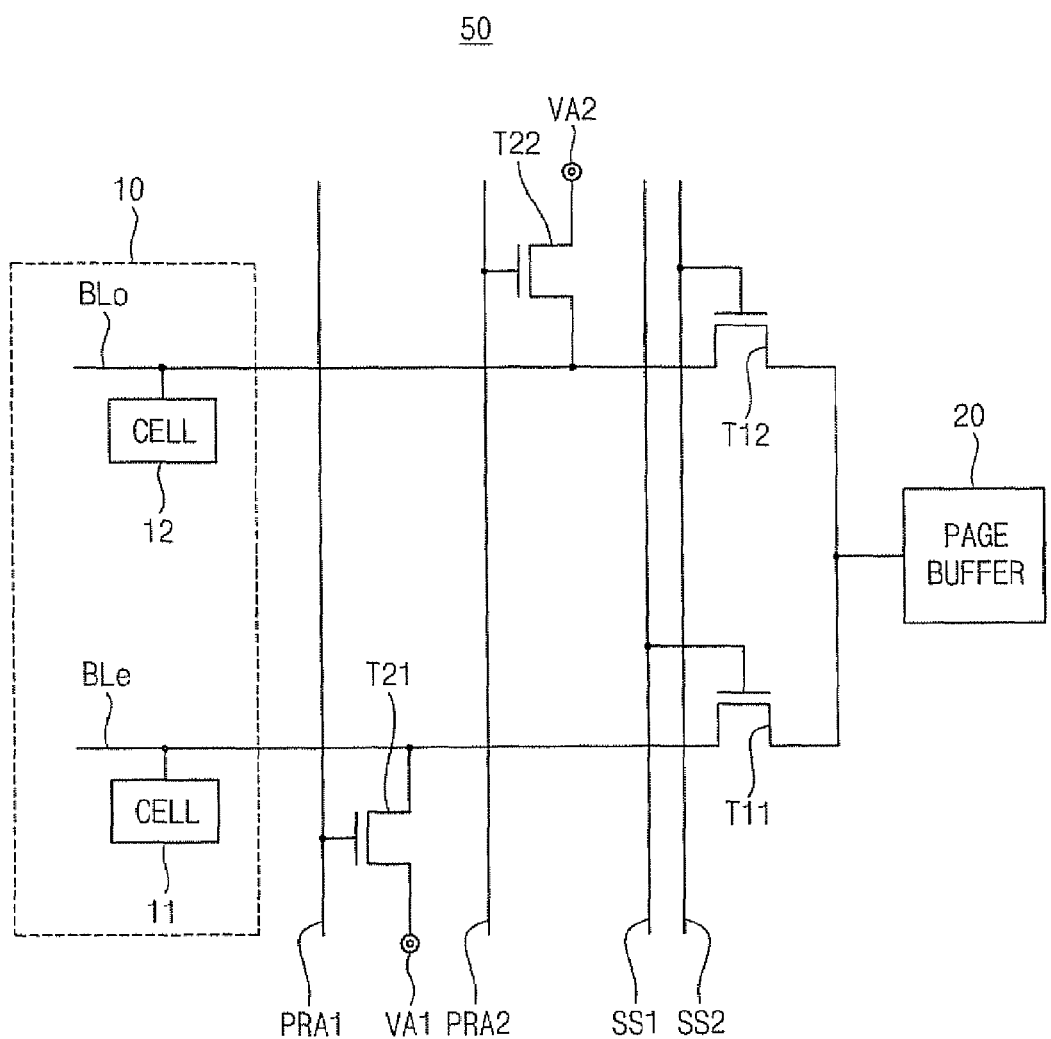
FIG. 3 is a circuit diagram illustrating a conventional non-volatile memory device.
Figure 4:
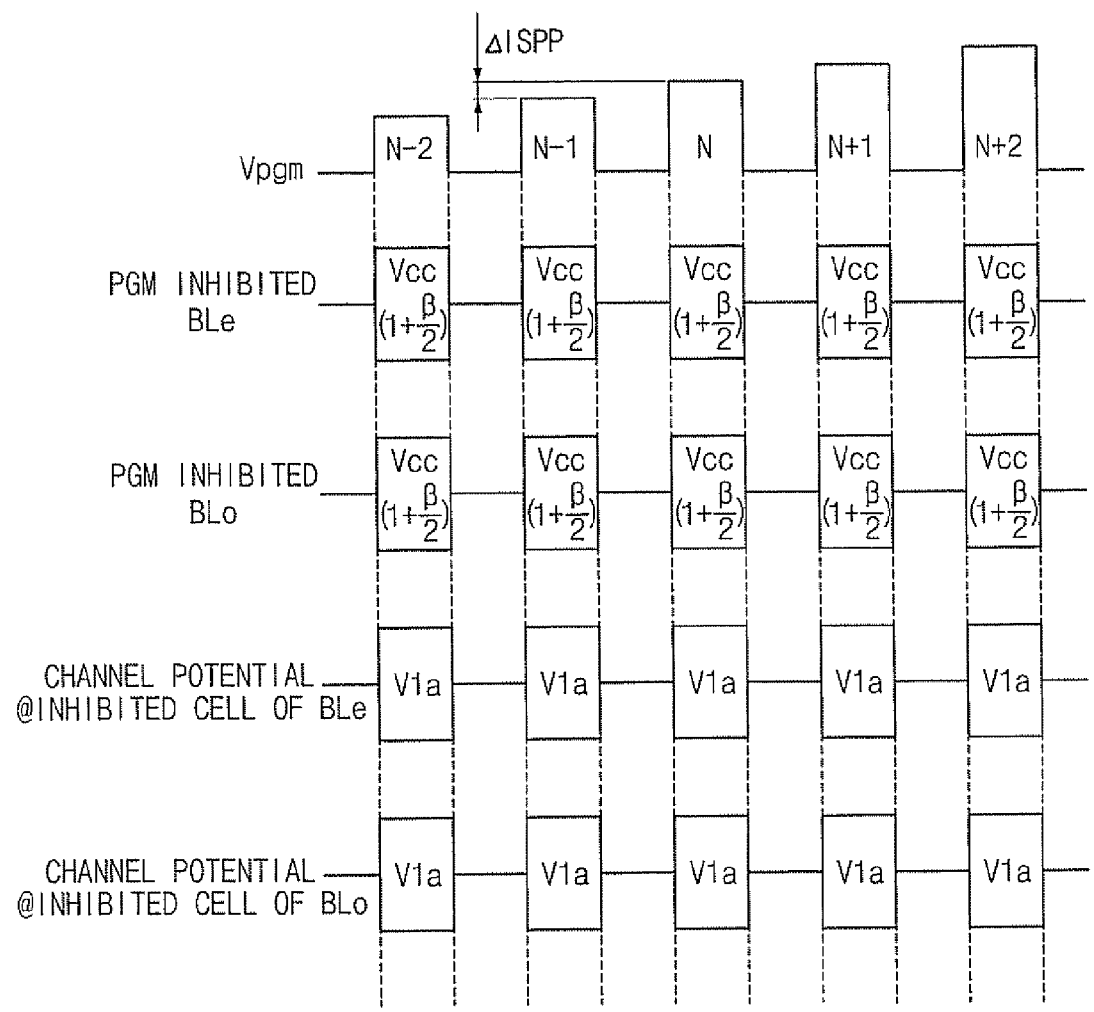
FIG. 4 is a diagram illustrating voltage variations of bitlines and channels in the non-volatile memory device of FIG. 3.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise.

It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

In the figures, the dimensions of structural components, including layers and regions among others, are not to scale and may be exaggerated to provide clarity of the concepts herein. It will also be understood that when a layer (or layer) is referred to as being 'on' another layer or substrate, it can be directly on the other layer or substrate, or can be separated by intervening layers. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 5:
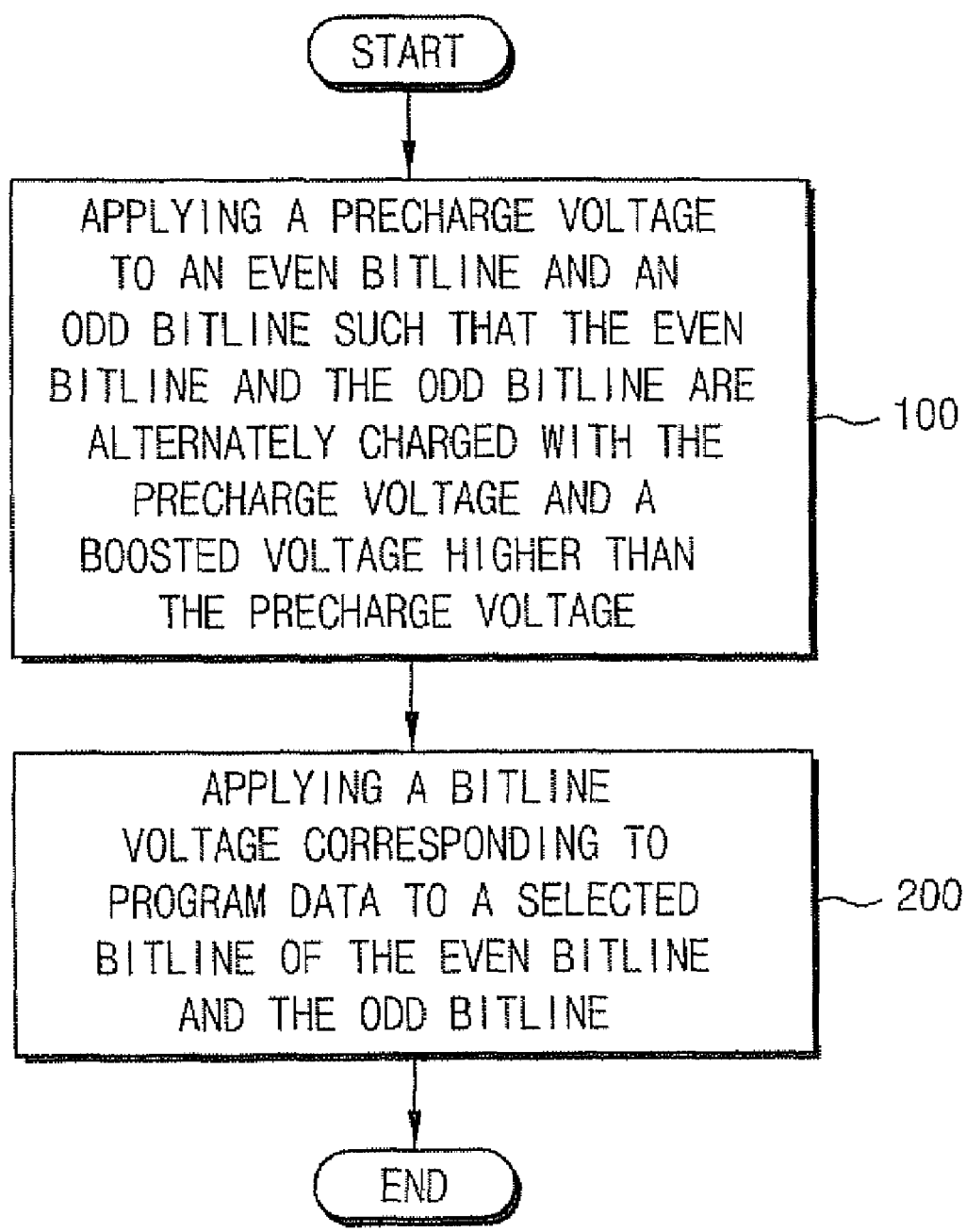
FIG. 5 is a flow chart illustrating operations for programming in a non-volatile memory device according to some embodiments of the present invention.

Reference is now made to FIG. 5, which is a flow chart illustrating operations for programming in a non-volatile memory device according to some embodiments of the present invention. In some embodiments of a non-volatile memory device for performing operations illustrated in FIG. 5, pulses may be sequentially applied to a selected wordline. A precharge voltage may be applied to an even bitline and an odd bitline such that the even bitline and the odd bitline may be alternately charged with the precharge voltage and a boosted voltage higher than the precharge voltage (block 100). Incremental step pulse programming (ISPP) may provide that a verifying operation and a reprogramming operation per pulse are repeated until verification is completed. In some embodiments, the odd bitline may be charged with the precharge voltage and the even bitline may be charged with the boosted voltage, with respect to a pulse, in turn, the even bitline may be charged with the precharge voltage and odd bitline may be charged with the boosted voltage, with respect to a next pulse.

After the bitlines are charged with the precharge voltage and the boosted voltage, respectively, a bitline voltage corresponding to program data may be applied to a selected bitline of the even bitline and the odd bitline (block 200). Some embodiments of a non-volatile memory device may provide that a plurality of memory cells may be arranged in matrix form. The memory cells in a row may be coupled to a common wordline and respectively coupled to even bitlines and odd bitlines, which may be alternately arranged in a row direction.

In some embodiments, the memory cells coupled to the even bitlines may form one page and the memory cells coupled to the odd bitlines may form another page. A programming operation may generally be performed per page in the non-volatile memory device, and one of the even bitlines and the odd bitlines may be selected to be programmed. A program-enabling voltage may be applied to each of the selected bitlines according to each bit value of program data, and the unselected bitlines may maintain the precharge voltage or the boosted voltage.

After the voltages of the bitlines are stabilized, a pulse as a program voltage may be applied to a selected wordline and a pass voltage may be applied to unselected wordlines. In some embodiments, a verifying operation and a reprogramming operation per pulse may be repeated using the incremental step pulses until verification is completed. Thus, operations according to blocks 100 and 200 may be repeated for each pulse, and the number of pulses until programming is completed may be changed according to characteristics of the memory cells.

In some embodiments, alternately applying a precharge voltage to the even and odd bitlines, as discussed above regarding block 100, may be performed by applying the precharge voltage to the odd bitline after floating the even bitline that is precharged with the precharge voltage for one pulse and by applying the precharge voltage to the even bitline after floating the odd bitline that is precharged with the precharge voltage for a next pulse, which may be repeated until programming is completed.

Figure 6:
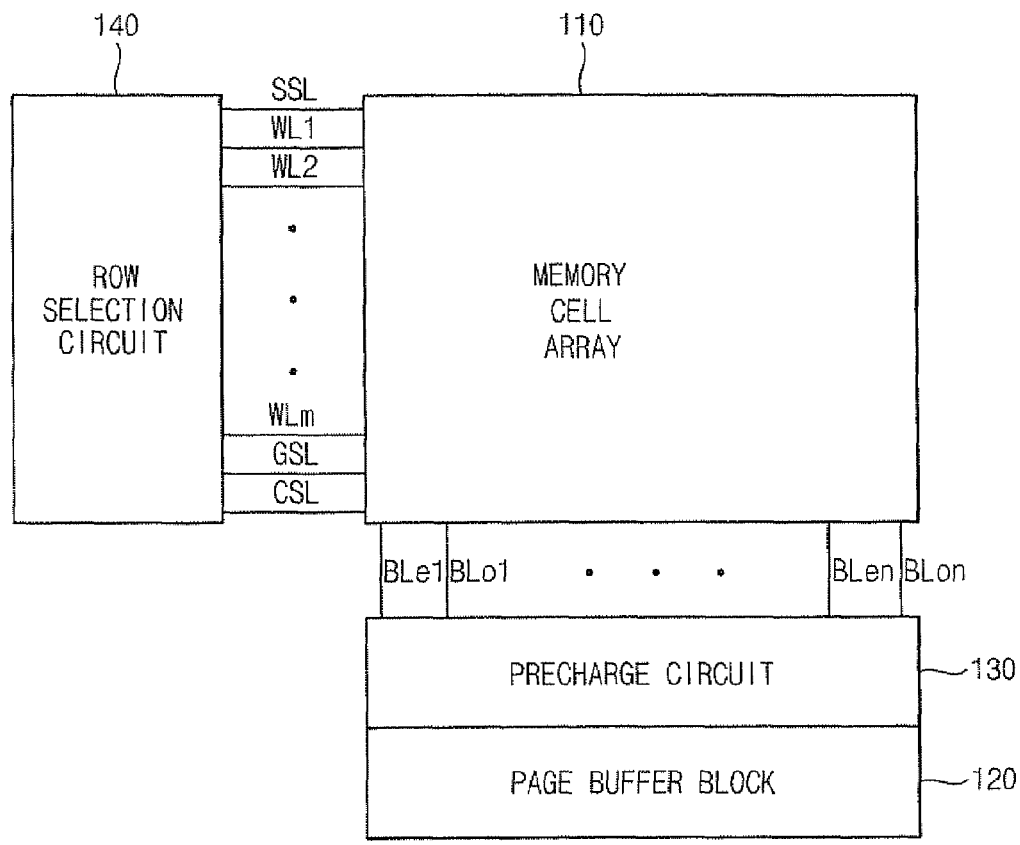
FIG. 6 is a block diagram illustrating a non-volatile memory device according to some embodiments of the present invention.

Reference is now made to FIG. 6, which is a block diagram illustrating a non-volatile memory device according to some embodiments of the present invention. In some embodiments, a non-volatile memory device 100 may include a memory cell array 110, a page buffer block 120, a precharge circuit 130 and a row selection circuit 140.

Figure 14:
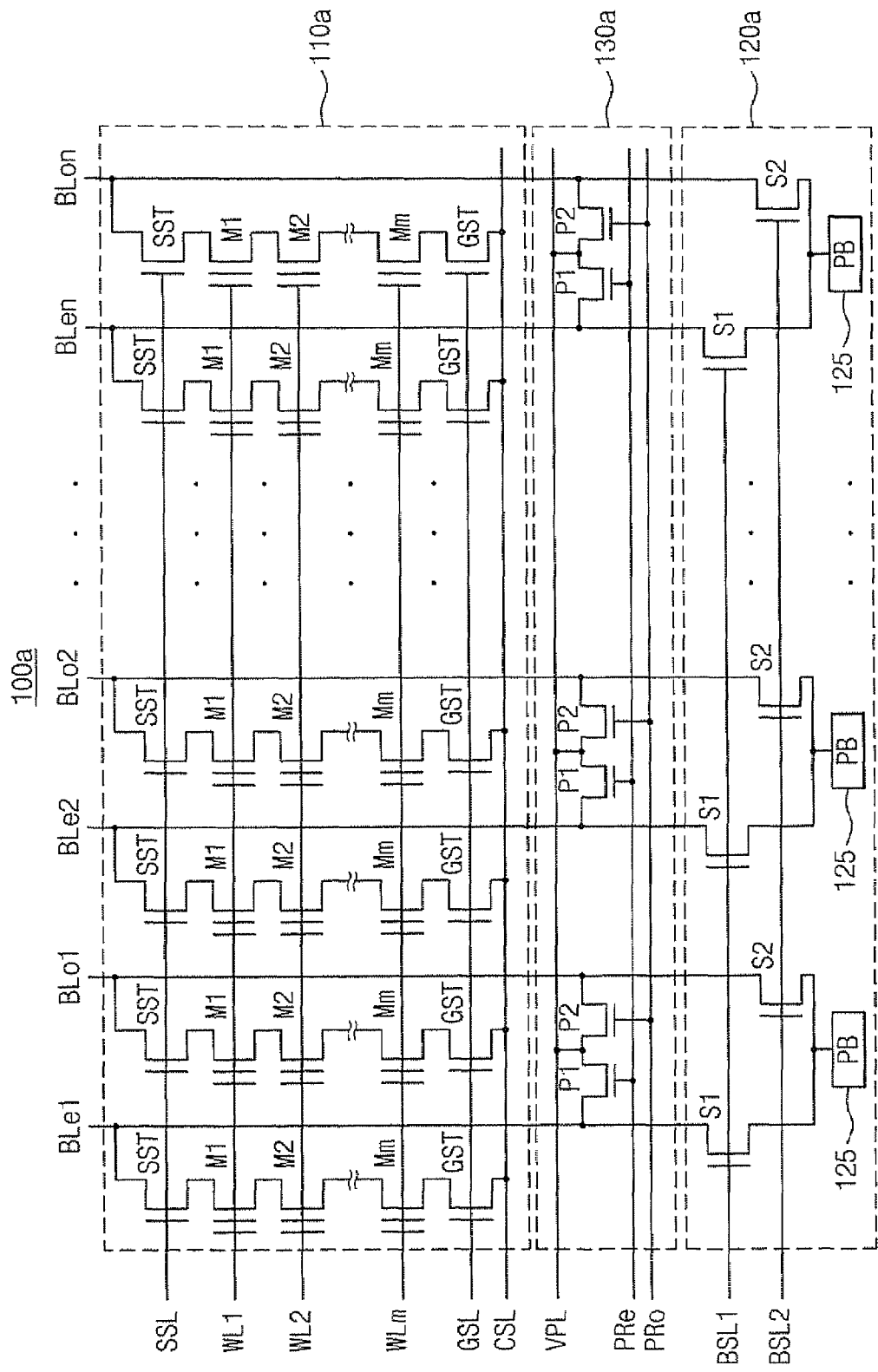
FIG. 14 is a circuit diagram illustrating a non-volatile memory device according to some embodiments of the present invention.

The memory cell array 110 may include a plurality of memory cells coupled to bitlines BLe and BLo and wordlines WL, respectively. As illustrated in FIG. 14, the memory cell array 110 may be a NAND-type memory cell array where the memory cells in a column may be serially coupled to form a NAND string. In some embodiments of a NAND-type memory device, the electrical connection between the NAND strings and the bitlines BLe and BLo may be controlled by a signal on a siring selection line SSL and the electrical connection between the NAND strings and the common source line CSL may be controlled by a signal on a ground selection line GSL.

The precharge circuit 130 may apply a precharge voltage to the even bitline BLe and the odd bitline BLo such that the even bitline BLe and the odd bitline BLo may be alternately charged with the precharge voltage and a boosted voltage higher than the precharge voltage. In some embodiments, an internal power supply voltage of the non-volatile memory device may be used as the precharge voltage.

In some embodiments, the page buffer block 120 may apply a bitline voltage corresponding to each bit value of the program data to a selected bitline of the even bitline and the odd bitline. For example, the page buffer block 120 may apply a ground voltage of 0 V as a program-enabling voltage to the corresponding selected bitline if the bit value of the program data is logic low, that is, '0'. On the contrary, if the bit value of the program data is logic high, that is, '1', the page buffer block 120 may apply a power supply voltage Vcc as a program-inhibiting voltage to the corresponding bitline, or the program-inhibited bitline may maintain the precharge voltage or the boosted voltage.

In some embodiments, the row selection circuit 140 may apply sequentially incremental step pulses to a selected wordline. The row selection circuit 140 may select one of the wordlines WL in response to row address signal and apply the pulses as a program voltage to the selected wordline and a pass voltage to the unselected wordlines. In some embodiments of an ISPP method, a level of the pulses may be increased as a verifying operation and a reprogramming operation may be repeated.

Figure 7:
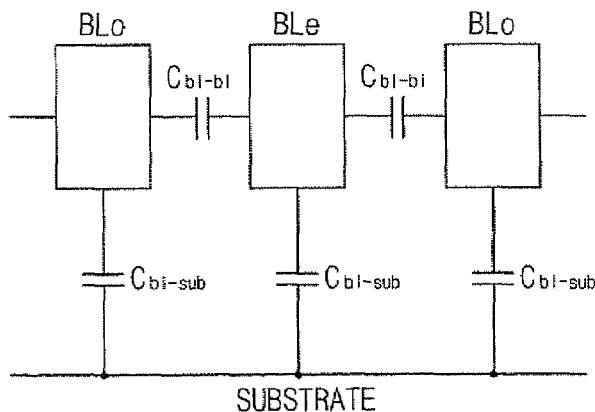
FIG. 7 is a diagram illustrating capacitive coupling between bitlines according to some embodiments of the present invention.

Reference is now made to FIG. 7, which is a diagram illustrating capacitive coupling between bitlines. In FIG. 7, $C_{bI-bI}$ indicates a parasitic capacitance between the adjacent bitlines and $C_{bI-sub}$ indicates a parasitic capacitance between the bitline and the substrate.

For example, the even bitline BLe may be precharged with a power supply voltage Vcc. If the power supply voltage is applied to the odd bitline BLo after floating the precharged even bitline BLe, the voltage of the even bitline BLe may be increased to a boosted voltage Vboost by the capacitive coupling between the adjacent bitlines. For example, Equation 2 provides for the boosted voltage as follows:

$$V\text{boost} = Vcc + \beta Vcc = (1+\beta)Vcc \qquad \text{Equation 2}$$

where Vcc is the power supply voltage and $\beta$ is the bitline coupling coefficient.

The bitline coupling coefficient $\beta$ may be determined according to a configuration of the memory cell formed in the substrate and may be represented by the following expression:

$$\beta = 2C_{bI-bI}/(2C_{bI-bI} + C_{bI-sub}) \qquad \text{Equation 3}$$

where $C_{bI-bI}$ is the parasitic capacitance between the adjacent bitlines and $C_{bI-sub}$ is the parasitic capacitance between the bitline and the substrate.

In some embodiments, the interval between the bitlines decreases to increase an integration rate of the memory cell array, and thus the bitline coupling coefficient $\beta$ may be increased. For example, in some embodiments, $\beta$ is about 0.82 when $C_{bI-bI}$ is about 2.3 times greater than $C_{bI-sub}$. As such, a part of bitlines may be charged with the boosted voltage Vboost higher than the power supply voltage Vcc using the capacitive coupling between the bitlines.

Figure 8:
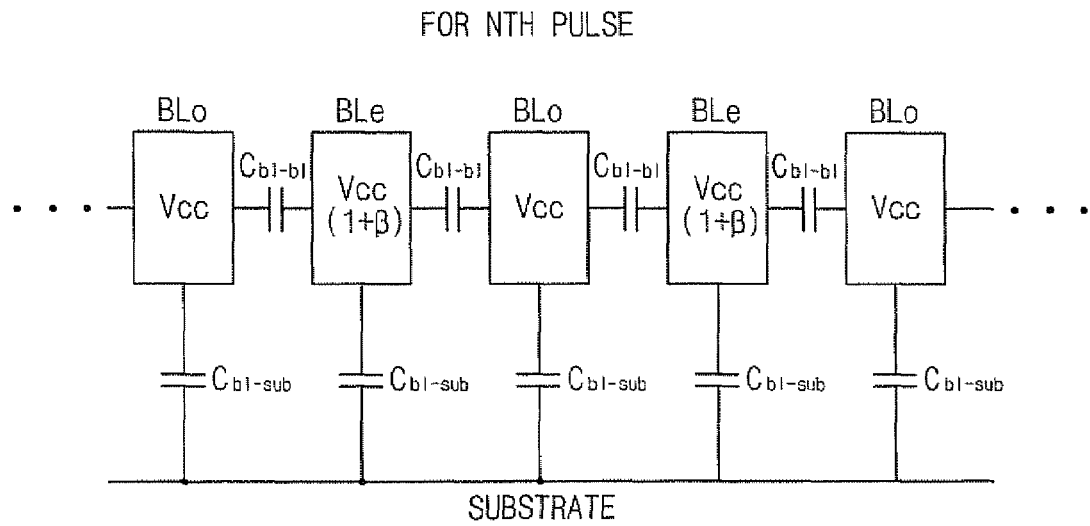
FIGS. 8 and 9 are diagrams illustrating bitline voltages with respect to two consecutive pulses in a non-volatile memory device of FIG. 6.
Figure 9:
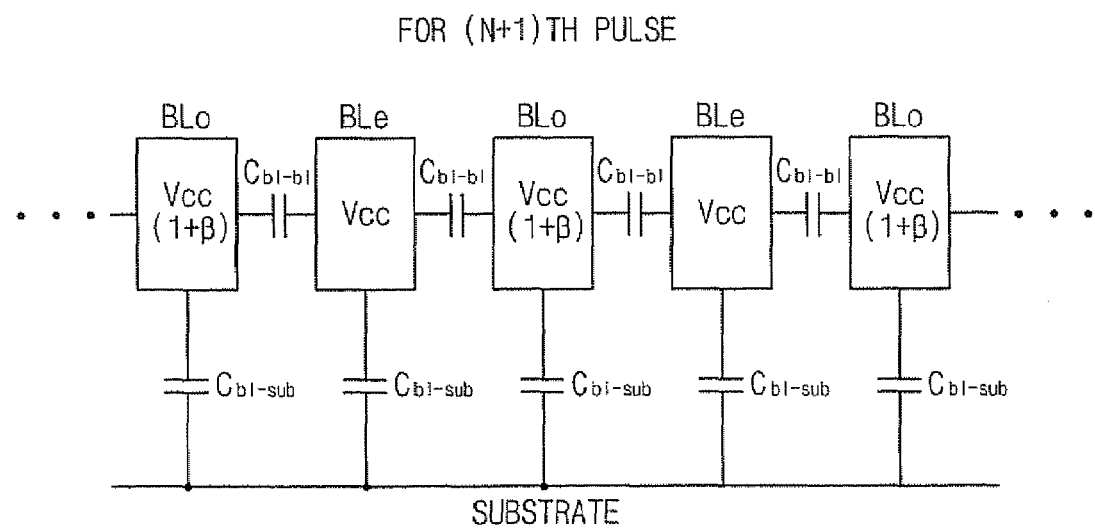

Reference is now made to FIGS. 8 and 9, which are diagrams illustrating bitline voltages with respect to two consecutive pulses in the non-volatile memory device of FIG. 6. By way of example, a power supply voltage Vcc may be used as a precharge voltage in FIGS. 8 and 9. FIG. 8 relates to an arbitrary Nth pulse of incremental step pulses and FIG. 9 relates to a (N+1)th pulse following the Nth pulse. Although illustrated as program-inhibited bitlines FIGS. 8 and 9, the voltage of the bitlines to be programmed may be decreased to a program-enabling voltage, for example, a ground voltage of 0 V, before the pulse is applied to the selected wordline.

In programming during the Nth pulse, the program-inhibited odd bitlines BLo may be charged with the power supply voltage Vcc and the program-inhibited even bitlines BLe may be charged with the boosted voltage Vboost (that is, $(1+\beta)$Vcc) that is higher than the power supply voltage Vcc, as illustrated in FIG. 8.

In contrast, in programming during the (N+1)th pulse next to the Nth pulse, the program-inhibited even bitlines BLe may be charged with the power supply voltage Vcc and the program-inhibited odd bitlines BLo may be charged with the boosted voltage Vboost, as illustrated in FIG. 9.

In this regard, the program-inhibited even bitline BLe and the program-inhibited odd bitline BLo may be alternately charged with the precharge voltage and a boosted voltage higher than the precharge voltage, thereby uniformly reducing the program disturbance of the even and odd bitlines without increasing the program time.

Figure 10:
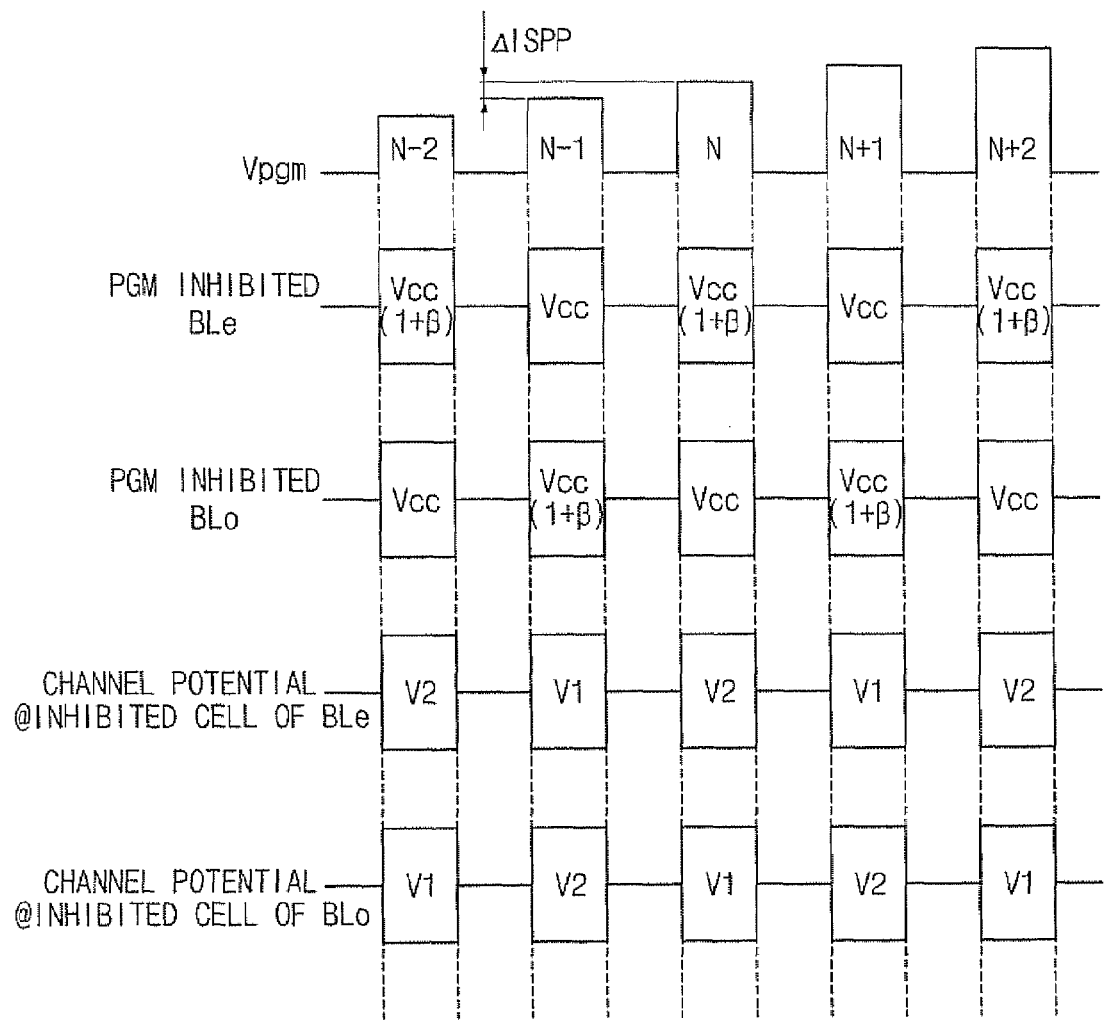
FIG. 10 is a diagram illustrating voltage variations of bitlines and channels in programming operations according to some embodiments of the present invention.

Reference is now made to FIG. 10, which is a diagram illustrating voltage variations of bitlines and channels in programming operations according to some embodiments of the present invention. The precharged voltages Vcc and Vcc(1+$\beta$) of the program-inhibited bitlines BLe and BLo and boosted channel voltages V1 and V2 are illustrated with respect to each pulse of the incremental step pulses, which may have voltage levels increasing by a step of $\Delta$ISPP.

As an (N−2)th pulse through an (N+2)th pulse are sequentially applied, the program-inhibited even bitline BLe and the program-inhibited odd bitline BLo may be alternately charged with the precharge voltage Vcc and the boosted voltage Vcc(1+$\beta$) higher than the precharge voltage Vcc. According to the voltages Vcc and Vcc(1+$\beta$) of the program-inhibited bitlines, the memory cells coupled to the program-inhibited bitlines may be alternately increased to the boosted channel voltages V1 and V2, respectively.

Only the voltages of the program-inhibited bitlines and the channels voltages of the corresponding memory cells are illustrated in FIG. 10, in some embodiments, the voltage of the program-enabled bitlines pertaining to the selected bitline of the even and odd bitlines may be decreased to a program-enabling voltage before the pulse is applied to the selected wordline. The unselected bitlines may be maintained at the voltages Vcc or Vcc(1+$\beta$) when the pulse is applied to the selected wordline.

Figure 11:
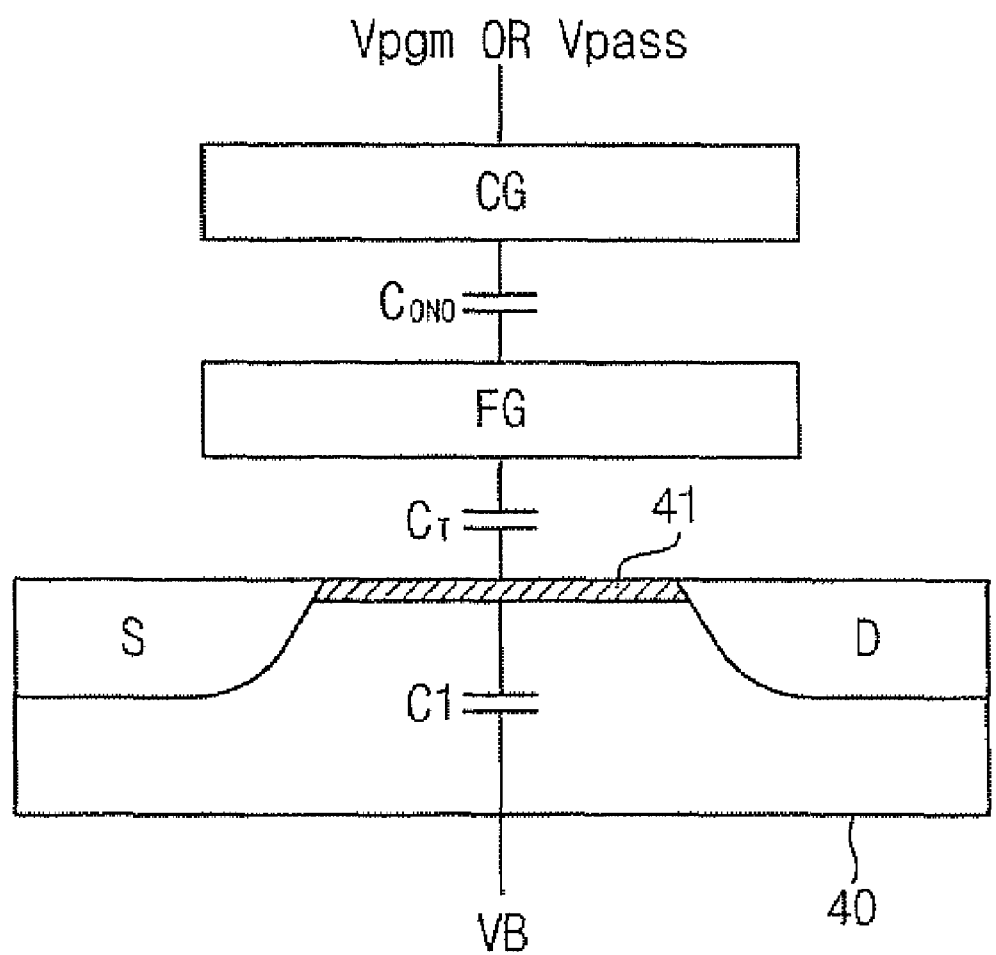
FIG. 11 is a cross-sectional view of a memory cell for describing a boosting effect of a channel according to some embodiments of the present invention.

Reference is now made to FIG. 11, which is a cross-sectional view of a memory cell for describing a boosting effect of a channel according to some embodiments of the present invention. In some embodiments, to form a memory cell, a source S and a drain D are formed in an upper portion of a substrate 40. A floating gate FG and a control gate CG may be formed over the substrate 40 between the source S and the drain D. A dielectric material such as oxide/nitride/oxide (ONO) having a capacitance $C_{ONO}$ may fill the space between the control gate CG and the floating gate FG, and a tunneling oxide having a capacitance $C_T$ may fill the space between the floating gate FG and the surface of the substrate 40.

If a high voltage such as a program voltage Vpgm and a pass voltage Vpass is applied to the control gate CG, a channel 41 may be formed in a surface portion of the substrate 40 connecting the source S and the drain D. A coupling coefficient r may be determined by the capacitance C1 between a substrate voltage VB and the channel 41 and a capacitance C2, which is an equivalent capacitance between the channel 41 and the control gate CG using the following Equation 4:

$$r = C2/(C1+C2) \qquad \text{Equation 4.}$$

When the program voltage Vpgm and the pass voltage Vpass are applied to the control gates CG of the serially coupled memory cells in a NAND string, the channel voltages of the serially coupled memory cells may be boosted by the capacitive coupling between the memory cells. The boosted channel voltage may depend on the coupling coefficient r, the number of the memory cells serially coupled in the single NAND string and/or the voltage applied to the control gate CG.

The channel 41 may be boosted lo a higher voltage as the voltage of the channel 41 during a precharge operation is higher. Referring back to FIG. 10, the boosted channel voltage V2, which is boosted from the previous channel voltage $(1+\beta)$Vcc, may be higher than the boosted channel voltage V1, which is boosted from the previous channel voltage Vcc.

Figure 12:
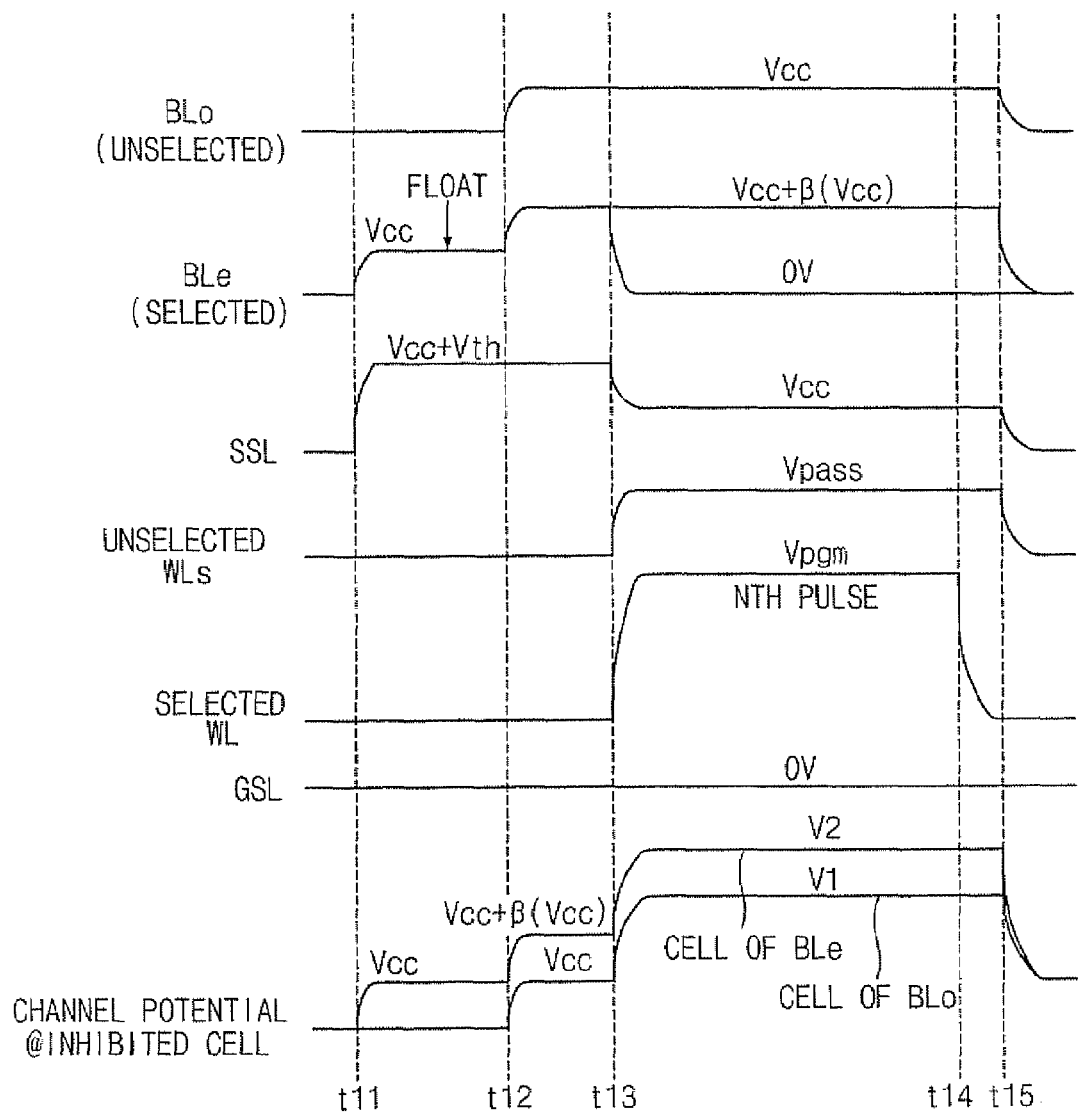
FIGS. 12 and 13 are timing diagrams illustrating operations for of programming in a non-volatile memory device according to some embodiments of the present invention.
Figure 13:
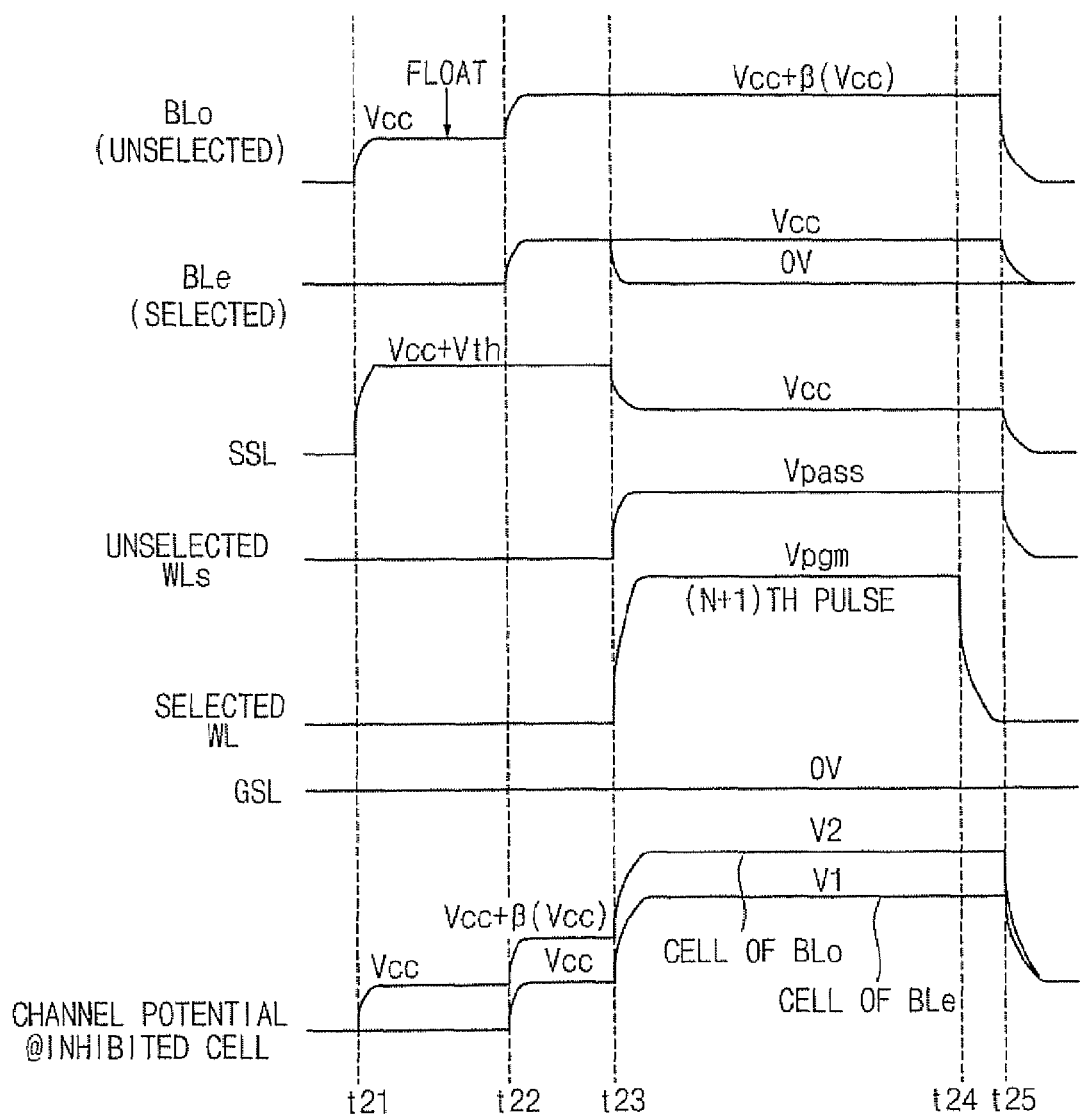

Reference is now made to FIGS. 12 and 13, which are timing diagrams illustrating a method of programming in a non-volatile memory device according to some embodiments of the present invention. By way of example, it is assumed that the even bitlines BLe are selected among the even bitlines BLe and the odd bitlines BLo.

Referring to FIG. 12, a precharge voltage such as a power supply voltage Vcc is applied to a selected even bitline BLe at time t11. At the same time, a voltage Vcc+Vth corresponding to a sum of the power supply voltage Vcc and a threshold voltage Vth of a string selection transistor is applied to a string selection line SSL. The string selection transistor is turned on, and thus the channel coupled to the even bitline BLe is charged with the precharge voltage Vcc. After the channel coupled to the even bitline BLe is stabilized at the precharge voltage Vcc, the even bitline BLe may be floated between time t11 and time t12.

If the precharge voltage Vcc is applied to the unselected odd bitline BLo at time t12, the floated even bitline BLe having the precharge voltage Vcc may be increased by capacitive coupling between the adjacent bitlines and the odd bitline BLo may be charged with the precharge voltage Vcc. As a result, the even bitline BLe and the corresponding channel may have the boosted voltage Vboost, that is, $(1+\beta)$Vcc, and the odd bitline BLo and the corresponding channel may have the precharge voltage Vcc.

At time t13, a bitline voltage according to each bit value of program data is applied to the selected even bitline BLe. The unselected odd bitline BLo is maintained at the precharge voltage Vcc. For example, the even bitline BLe may maintain the boosted voltage Vboost if the corresponding bit value of the program data is logic high '1', and the voltage of the even bitline BLe may be decreased to a program-enabling voltage such as a ground voltage of 0 V if the corresponding bit value of the program data is logic low '0'.

The Nth pulse may include a program voltage Vpgm that may be applied to a selected wordline and a pass voltage Vpass that may be applied to unselected wordlines at time t13. The string selection transistor may be turned off at time t13 by decreasing the voltage of the string selection line SSL. Accordingly, the channel coupled to the program-inhibited odd bitline BLo may be increased to a first boosted channel voltage V1 and the channel coupled to the program-inhibited even bitline BLe may be increased to a second boosted channel voltage V2 that is higher than the first boosted channel voltage V1.

The program voltage Vpgm is deactivated at time t14, and programming with the Nth pulse is finished at time t15. The signal on the ground selection line GSL may be deactivated during a programming operation, and thus the NAND string may be electrically disconnected from the common source line CSL.

In programming with the (N+1)th pulse of FIG. 13, in comparison with programming with the Nth pulse of FIG. 12, the unselected odd bitline BLo may be precharged in advance and then the selected even bitline BLe may be precharged while the precharged odd bitline BLo is floated. Hereinafter, a operations as described above regarding FIG. 12 are not repeated.

Referring to FIG. 13, the precharge voltage such as the power supply voltage Vcc may be applied to the unselected odd bitline BLo at time t21. After the channel coupled to the odd bitline BLo is stabilized at the precharge voltage Vcc, the odd bitline BLo may be floated between time t21 and time t22.

In some embodiments, if the precharge voltage Vcc is applied to the selected even bitline BLe, the floated odd bitline BLo having the precharge voltage Vcc may be increased by capacitive coupling between the adjacent bitlines and the even bitline BLo may be charged with the precharge voltage Vcc. As a result, the odd bitline BLo and the corresponding channel may have the boosted voltage Vboost, that is, $(1+\beta)$Vcc, and the even bitline BLe and the corresponding channel may have the precharge voltage Vcc.

At time t23, a bitline voltage according to each bit value of program data may be applied to the selected even bitline BLe. In addition, during the (N+1)th pulse, the program voltage Vpgm may be applied to the selected wordline and the pass voltage Vpass may be applied to the unselected wordlines at time t23.

Accordingly, the channel coupled to the program-inhibited even bitline BLe may be increased to the first boosted channel voltage V1 and the channel coupled to the program-inhibited odd bitline BLo may be increased to the second boosted channel voltage V2 that is higher than the first boosted channel voltage V1. The program voltage Vpgm may be deactivated at time t24, and programming with the (N+1)th pulse is finished at time t25.

As described above regarding FIGS. 12 and 13, the even bitline BLe and the odd bitline BLo may be alternately boosted using capacitive coupling between the adjacent bitlines until programming with the pulses is completed.

Reference is now made to FIG. 14, which is a circuit diagram illustrating a non-volatile memory device 100a according to some embodiments of the present invention. A memory cell array 110a may be formed with NAND strings extended in a column direction. In some embodiments, each NAND string may include a plurality of memory cells M1 through Mm serially coupled between a string selection transistor SST and a ground selection transistor GST. The memory cells Mk pertaining to each of the NAND strings may be commonly coupled to a corresponding wordline WLk of the wordlines WL1 through WLm. The string selection transistors SST may be commonly coupled to a string selection line SSL, and the ground selection transistors GST are commonly coupled to a common source line CSL.

Although some embodiments are illustrated as a NAND-type memory cell array 110a, some embodiments of the present invention may be adaptable to an arbitrary non-volatile memory device in which the incremental step pulses may be used as the program voltage applied to the selected wordline. In some embodiments, the even bitlines may correspond to one page and the odd bitlines may correspond to another page.

In some embodiments, the row selection circuit 140 of FIG. 6 may apply a program voltage to a wordline that is selected based on a row address signal and may apply a pass voltage to unselected wordlines. As discussed above, in some embodiments, the incremental step pulses may be used as the program voltage applied to the selected wordline.

In some embodiments, the page buffer block 120a includes a plurality of page buffers 125 or page registers. Each page buffer 125 may be coupled to a pair of the even bitline BLe and the odd bitline BLo. A page coupled to the even bitlines BLe and a page coupled to the odd bitlines BLo may be alternatively selected by the transistors S1 and S2, which may operate in response to bitline selection signals BSL1 and BSL2.

In some embodiments, the voltage levels for a programming operation and operation timings of the memory cell array 110, the page buffer block 120, and the row selection circuit 140 of FIG. 6 are controlled by a memory controller (not shown).

In some embodiments, the precharge circuit 130a may apply a precharge voltage to the bitlines BLe and BLo such that the even bitline BLe and the odd bitline BLo may be alternately charged with the precharge voltage and a boosted voltage higher than the precharge voltage.

In some embodiments, the precharge circuit 130a may apply the precharge voltage to the odd bitline BLo after floating the even bitline BLe that is precharged with the precharge voltage during a precharge operation corresponding to an Nth pulse of the incremental step pulses, and in turn, may apply the precharge voltage to the even bitline BLe after floating the odd bitline BLo that is precharged with the precharge voltage during a precharge operation corresponding to a (N+1)th pulse of the incremental step pulses.

In some embodiments, the precharge circuit 130a may include a first transistor P1 that is configured to control an electrical connection between the even bitline BLe and a precharge voltage supply line VPL, and a second transistor P2 that is configured to control an electrical connection between the odd bitline BLo and the precharge voltage supply line VPL.

In some embodiments, the second transistor P2 may be turned on after the first transistor P1 is turned off during a precharge operation corresponding to an Nth pulse of the incremental step pulses, and the first transistor P1 may be turned on after the second transistor P2 is turned off during a precharge operation corresponding to a (N+1)th pulse of the incremental step pulses.

As such, the precharge circuit may control timings of applying the precharge voltage so that the even bitlines BLe and the odd bitlines BLo can be alternately boosted by capacitive coupling between the adjacent bitlines.

In some embodiments, the non-volatile memory device may further include a precharge control circuit (not shown) for generating a first precharge signal PRe and a second precharge signal PRo. The first precharge signal PRe may be applied to a gate of the first transistor P1 and the second precharge signal PRo may be applied to a gate of the second transistor P2 to control switching timings of the transistors P1 and P2. The precharge control circuit may be included in the precharge circuit 130a and the memory controller (not shown).

Figure 15:
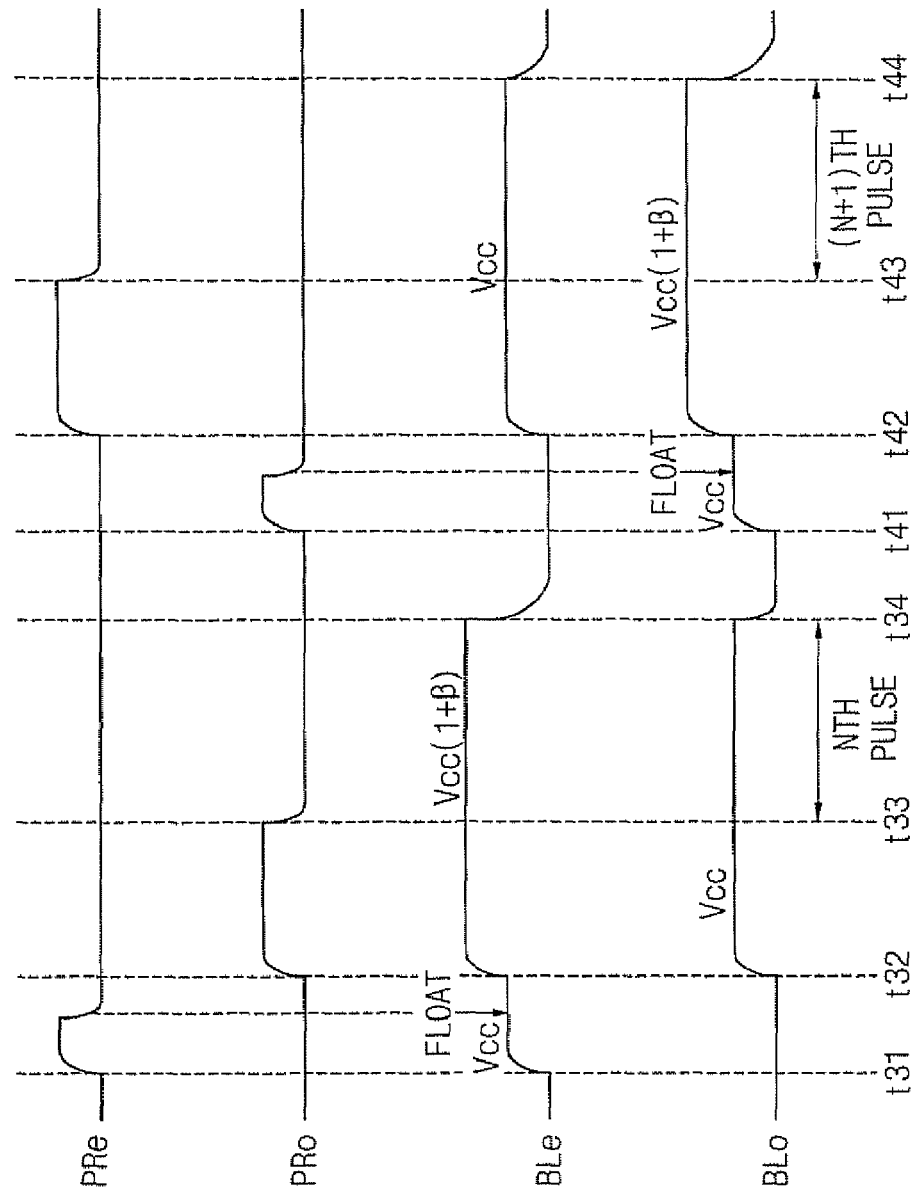
FIG. 15 is a timing diagram illustrating an operation of the precharge circuit in FIG. 14 according to some embodiments of the present invention.

Reference is now made to FIG. 15, which is a timing diagram illustrating operation of the precharge circuit in FIG. 14 according to some embodiments of the present invention. The timing diagram includes the precharge signals PRe and PRo, and the voltages of the bitlines BLe and BLo according to the precharge signals PRe and PRo. Programming with the Nth pulse of the incremental step pulses may be performed during time t31 through t34, and subsequent programming with the (N+1)th pulse of the incremental step pulses may be performed during time t41 through t44.

When the first precharge signal PRe is activated at time t31, the first transistor P1 is turned on, and thus the precharge voltage, for example, the power supply voltage Vcc, may be applied to the even bitline BLe. After the channel coupled to the even bitline BLe is stabilized at the precharge voltage Vcc, the even bitline BLe may be floated between time t31 and time t32 by deactivating the first precharge signal PRe.

When the second precharge signal PRo is activated at time t32, the second transistor P2 is turned on, and thus the precharge voltage Vcc may be applied to the odd bitline BLo. Accordingly, the even bitline BLe and the corresponding channel may have the boosted voltage Vboost, that is, (1+β) Vcc, and the odd bitline BLo and the corresponding channel may have the precharge voltage Vcc. The second precharge signal PRo may be deactivated at time t33, and the Nth pulse may be applied to the selected wordline.

In contrast, in programming with the (N+1)th pulse, the second precharge signal PRo may be activated at time t41 and the second precharge signal PRo may be deactivated during time t41 and t42 after the channel coupled to the odd bitline BLo is stabilized. The first precharge signal PRe may be activated at time t42 and, at time t43 the first precharge signal PRe may be deactivated and the (N+1)th pulse may be applied to the selected wordline. Accordingly, contrary to programming with the Nth pulse, the odd bitline BLo and the corresponding channel may have the boosted voltage Vboost, and the even bitline BLe and the corresponding channel may have the precharge voltage Vcc.

Even though the present invention has been described with reference to exemplary embodiments of the NAND-type flash memory device, it is understood to those skilled in the art that the present invention can be adaptable to an arbitrary non-volatile memory device in which the incremental step pulses are used as the program voltage applied to the selected wordline, and the even bitlines correspond to one page and the odd bitlines correspond to another page.

As mentioned above, non-volatile memory devices and methods of programming according to some embodiments of the present invention may use capacitive coupling between adjacent bitlines to reduce program disturbance, and as a result, a window margin of a pass voltage may be enlarged.

Also, non-volatile memory devices and methods of programming according to example embodiments of the present invention may reduce the program disturbance without increasing a program time and without largely changing the configuration of the memory device.

While the example embodiments of the present invention and their advantages have been described in detail, it should be understood that various changes, substitutions and alterations may be made herein without departing from the scope of the invention.

What is claimed is:

1. A method of programming in a non-volatile memory device, using incremental step pulses as a program voltage that is applied to a selected wordline, the method comprising:
   applying a precharge voltage to an even bitline and an odd bitline such that the even bitline and the odd bitline are alternately charged with the precharge voltage and a boosted voltage that is higher than the precharge voltage; and
   applying a bitline voltage corresponding to program data to a selected bitline of the even bitline and the odd bitline, wherein applying the precharge voltage comprises:
   applying the precharge voltage to the odd bitline after floating the even bitline that is precharged with the precharge voltage; and
   applying the precharge voltage to the even bitline after floating the odd bitline that is precharged with the precharge voltage.

2. The method of claim 1, wherein applying the precharge voltage to the odd bitline after floating the even bitline and applying the precharge voltage to the even bitline after floating the odd bitline are alternately repeated until writing of the program data into a memory cell is completed.

3. The method of claim 1, wherein applying the precharge voltage to the odd bitline after floating the even bitline comprises:
   applying the precharge voltage to the even bitline;
   floating the even bitline after a channel of a memory cell coupled to the even bitline is charged with the precharge voltage; and applying the precharge voltage to the odd bitline to boost the floated even bitline to the boosted voltage.

4. The method of claim 1, wherein applying the precharge voltage to the even bitline after floating the odd bitline comprises:
applying the precharge voltage to the odd bitline;
floating the odd bitline after a channel of a memory cell coupled to the odd bitline is charged with the precharge voltage; and
applying the precharge voltage to the even bitline to boost the floated odd bitline to the boosted voltage.

5. The method of claim 1, wherein a channel of a memory cell coupled to the selected bitline having the precharge voltage is boosted to a first voltage and a channel of a memory cell coupled to the selected bitline having the boosted voltage is further boosted to a second voltage higher than the first voltage, when each of the incremental step pulses is applied to the selected wordline.

6. The method of claim 1, wherein applying the precharge voltage comprises:
connecting a first transistor for supplying the precharge voltage to the even bitline;
connecting a second transistor for supplying the precharge voltage to the odd bitline; and
controlling switching timings of the first and second transistors such that the even bitline and the odd bitline are alternately charged with the precharge voltage and the boosted voltage.

7. The method of claim 6, wherein controlling the switching timings of the first and second transistors comprises:
turning on the second transistor after turning off the first transistor; and
turning on the first transistor after turning off the second transistor.

8. The method of claim 7, wherein turning on the second transistor after turning off the first transistor and turning on the first transistor after turning off the second transistor are alternately repeated until writing of the program data into a memory cell is completed.

9. The method of claim 7, wherein turning on the second transistor after turning off the first transistor comprises:
turning on the first transistor to apply the precharge voltage to the even bitline;
turning off the first transistor after a channel of a memory cell coupled to the even bitline is charged with the precharge voltage; and
turning on the second transistor to apply the precharge voltage to the odd bitline.

10. The method of claim 7, wherein turning on the first transistor after turning off the second transistor comprises:
turning on the second transistor to apply the precharge voltage to the odd bitline;
turning off the second transistor after a channel of a memory cell coupled to the odd bitline is charged with the precharge voltage; and
turning on the first transistor to apply the precharge voltage to the even bitline.

11. The method of claim 1, wherein applying the precharge voltage comprises:
applying the precharge voltage to the odd bitline after floating the even bitline that is precharged with the precharge voltage during a precharge operation corresponding to an Nth pulse of the incremental step pulses; and
applying the precharge voltage to the even bitline after floating the odd bitline that is precharged with the precharge voltage during a precharge operation corresponding to a (N+1)th pulse of the incremental step pulses.

12. The method of claim 1, wherein the precharge voltage comprises an internal power supply voltage of the non-volatile memory device.

13. The method of claim 1, wherein applying the bitline voltage comprises:
applying a program-enabling voltage lower than the precharge voltage to the selected bitline when a corresponding bit value of the program data is logic low; and
maintaining the precharge voltage or the boosted voltage charged at the selected bitline when the corresponding bit value of the program data is logic high.

14. The method of claim 1, wherein the non-volatile memory device comprises a NAND-type flash memory device.

15. A non-volatile memory device, comprising:
a memory cell array including memory cells coupled to a plurality of bitlines and a plurality of wordlines;
a precharge circuit that is configured to alternately apply a precharge voltage to an even bitline of the plurality of bitlines and an odd bitline of the plurality of bitlines, the precharge voltage configured to alternately charge the even bitline and the odd bitline with the precharge voltage and a boosted voltage that is higher than the precharge voltage;
a page buffer block that is configured to apply a bitline voltage that corresponds to program data to a selected bitline of the even bitline and the odd bitline; and
a row selection circuit that is configured to apply incremental step pulses to a selected wordline of the wordlines,
wherein the precharge circuit is configured to apply the precharge voltage to the odd bitline after floating the even bitline that is precharged with the precharge voltage during a precharge operation corresponding to an Nth pulse of the incremental step pulses and further configured to apply the precharge voltage to the even bitline after floating the odd bitline that is precharged with the precharge voltage during a precharge operation corresponding to a (N+1)th pulse of the incremental step pulses.

16. The non-volatile memory device of claim 15, wherein the precharge circuit comprises:
a first transistor that is configured to control an electrical connection between the even bitline and a precharge voltage supply line; and
a second transistor that is configured to control an electrical connection between the odd bitline and the precharge voltage supply line.

17. The non-volatile memory device of claim 16, wherein the second transistor is configured to turn on after the first transistor turns off during a precharge operation corresponding to an Nth pulse of the incremental step pulses and wherein the first transistor is configured to turn on after the second transistor turns off during a precharge operation corresponding to a (N+1)th pulse of the incremental step pulses.

18. The non-volatile memory device of claim 16, further comprising:
a precharge control circuit that is configured to generate a first precharge signal that is applied to a gate of the first transistor and a second precharge signal that is applied to a gate of the second transistor, wherein the second precharge signal is activated after the first precharge signal is deactivated during a precharge operation corresponding to an Nth pulse of the incremental step pulses and the first precharge signal is activated after the second precharge signal is deactivated during a precharge operation corresponding to a (N+1)th pulse of the incremental step pulses.

19. The non-volatile memory device of claim 15, wherein the boosted voltage is induced by capacitive coupling between adjacent ones of the even bitlines and the odd bitlines.

20. The non-volatile memory device of claim 15, wherein a channel of the memory cell coupled to the bitline having the precharge voltage is boosted to a first voltage and a channel of the memory cell coupled to the bitline having the boosted voltage is further boosted to a second voltage that is higher than the first voltage, when each of the incremental step pulses is applied to the selected wordline.

21. The non-volatile memory device of claim 15, wherein the precharge voltage comprises an internal power supply voltage of the non-volatile memory device.

22. The non-volatile memory device of claim 15, wherein the non-volatile memory device comprises a NAND-type flash memory device.

23. The non-volatile memory device of claim 15, wherein the page buffer block is configured to apply a program-enabling voltage that is lower than the precharge voltage to the selected bitline when a corresponding bit value of the program data is logic low and wherein the page buffer block is further configured to maintain the precharge voltage or the boosted voltage that is charged in the selected bitline when the corresponding bit value of the program data is logic high.

* * * * *